(12) United States Patent
Krilic

(10) Patent No.: US 10,186,310 B2
(45) Date of Patent: Jan. 22, 2019

(54) DIMM DRAM MEMORY CHIPS QUICK OPTICAL DATA ERASURE AFTER POWER CYCLING

(71) Applicant: Goran Krilic, Zagreb (HR)

(72) Inventor: Goran Krilic, Zagreb (HR)

(*) Notice: Subject to any disclaimer, the term of this patent is extended or adjusted under 35 U.S.C. 154(b) by 0 days.

(21) Appl. No.: 15/724,435

(22) Filed: Oct. 4, 2017

(65) Prior Publication Data

US 2018/0166116 A1  Jun. 14, 2018

Related U.S. Application Data

(63) Continuation-in-part of application No. 15/404,946, filed on Jan. 12, 2017, now abandoned, and a continuation-in-part of application No. 15/338,426, filed on Oct. 30, 2016, now abandoned.

(60) Provisional application No. 62/404,215, filed on Oct. 5, 2016, provisional application No. 62/249,225, filed on Oct. 31, 2015, provisional application No. 62/279,750, filed on Jan. 16, 2016.

(51) Int. Cl.
| | |
|---|---|
| G11C 11/40 | (2006.01) |
| G11C 11/409 | (2006.01) |
| G11C 11/419 | (2006.01) |
| G11C 11/4074 | (2006.01) |
| G11C 11/4072 | (2006.01) |
| G11C 11/4078 | (2006.01) |
| H01L 23/00 | (2006.01) |
| H01L 25/065 | (2006.01) |

(52) U.S. Cl.
CPC ........ *G11C 11/409* (2013.01); *G11C 11/4072* (2013.01); *G11C 11/4074* (2013.01); *G11C 11/4078* (2013.01); *G11C 11/419* (2013.01); *H01L 24/10* (2013.01); *H01L 24/42* (2013.01); *H01L 25/0657* (2013.01); *H01L 2225/06506* (2013.01); *H01L 2225/06562* (2013.01); *H01L 2924/1436* (2013.01); *H01L 2924/1437* (2013.01)

(58) Field of Classification Search
CPC .. G11C 11/409; G11C 11/4072; G11C 1/4074
USPC ........................................................ 365/149
See application file for complete search history.

(56) References Cited

U.S. PATENT DOCUMENTS

| | | | |
|---|---|---|---|
| 6,608,774 B1 * | 8/2003 | Rentzepis | B82Y 10/00 365/119 |
| 2011/0205601 A1 * | 8/2011 | Akimoto | G03G 21/046 358/475 |
| 2014/0223120 A1 * | 8/2014 | Franceschini | G06F 12/16 711/162 |

(Continued)

*Primary Examiner* — Anthan Tran
(74) *Attorney, Agent, or Firm* — Shalini Venkatesh

(57) ABSTRACT

Quick optical DRAM reset and data erasure can be performed during power down (power cycling) or chip cooling and removal from the socket. In this way cold boot attacks on DRAM secret information are prevented using simple and cheap embodiment. In wafer level packaging (chip scale package) die is usually on top (flip-chip) and metal interconnections does not interfere with penetrating light during chip illumination. IR light penetrates through chip's thin epoxy on top and it is absorbed in the die, near active layer, and generates electron-hole pairs. Electron-hole pairs diffuse to chip active layer and generate discharging photocurrents in PN junctions connected to DRAM capacitors.

8 Claims, 11 Drawing Sheets

(56) References Cited

U.S. PATENT DOCUMENTS

2014/0369139 A1\* 12/2014 Van Winkelhoff ....... G11C 7/22
                                                            365/189.07
2016/0098360 A1\* 4/2016 Gillespie ............... G06F 21/602
                                                            711/104

\* cited by examiner a)

b)

DIMM DRAM MEMORY CHIPS QUICK OPTICAL DATA ERASURE AFTER POWER CYCLING

This patent application claims priority of U.S. provisional application No. 62/404,215 filed on Oct. 5, 2016. This patent application is continuation in part of U.S. utility application Ser. No. 15/404,946 filed on Jan. 12, 2017 which claims priority of U.S. provisional application 62/279,750 (filing date 16 Jan. 2016). This patent application is continuation in part of U.S. utility application Ser. No. 15/338,426 filed on Oct. 30, 2016 which claims priority of U.S. provisional application No. 62/249,225 (filing date 31 Oct. 2015).

BACKGROUND OF THE INVENTION

It is well known that DRAM chips can retain data for seconds after being powered down (or DIMM removal from socket). If DIMM module is cooled down data can be retained for minutes. It opens up possibility for an attacker with access to the machine to extract vital information (password, cryptographic key). It can be done by computer power cycling and reboot from bootable USB source. Memory content, including sensitive data like password is automatically dumped to USB. Another option is DIMM cooling down to −50 deg. C., extraction of DIMM and insertion to a computer under attacker's control. Both methods are commonly known as a "cold boot attack". There are no efficient defense that is acceptable for low end devices.

Experiments performed by Princeton researchers and published in the article:

"Lest We Remember: Cold Boot Attacks on Encryption Keys"

J. Alex Halderman, Seth D. Schoent†, Nadia Heninger, William Clarkson, William Paul‡, Joseph A. Calandrino, Ariel J. Feldman, Jacob Appelbaum, and Edward W. Felten shows that DIMM (Dual Inline Memory Module) can retain data for tens of seconds after power is disconnected and up to few minutes if DIMM DRAM chips are cooled down to −50 deg. C. by spraying compressed air from inverted can. Thus an attacker has sufficient amount of time to remove DIMM from the computer and insert it to the computer under his control. Thus, either power cycling and boot from USB or physically removing DIMM enable retrieving of sensitive data including password/cryptographic key. Similar experiments were performed using Altera DE1 development board and Quartus II software that enables control (read, write and power cycling) of SRAM and DRAM memory chips.

DESCRIPTION OF THE INVENTION

Figure 6:
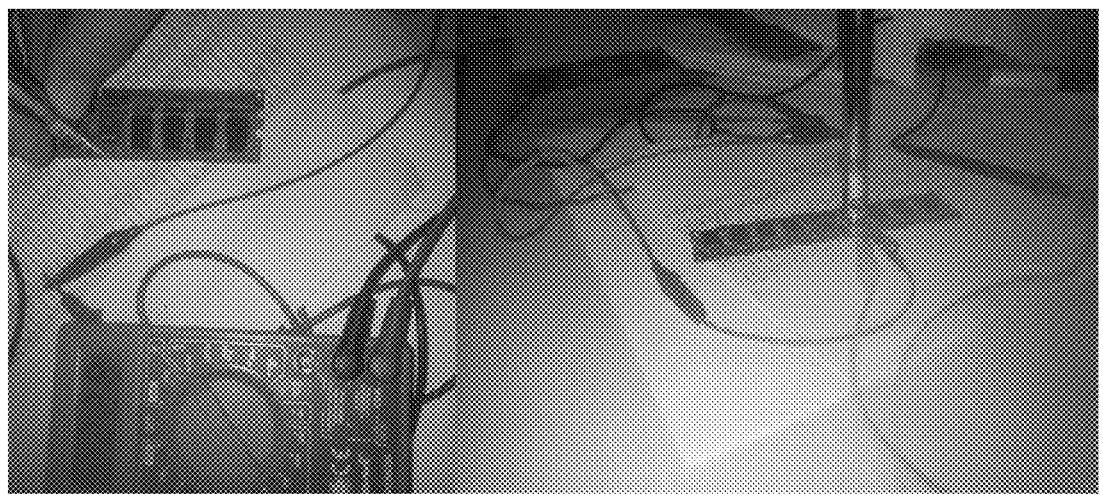

Various experiments show that CMOS chips if decapsulated and illuminated by visible light operate as photodetectors. Depending on the technology data in CMOS SRAM/DRAM can be manipulated. If focused laser beams are used particular memory cells can be set/reset. Illuminating the whole chip with light can yield either improved SRAM data remanence, US patent application US2015/0221363 A1 or data erasure in DRAM. Simple experiments are performed in order to check level of light transmittance&absorption and photocurrent generation in DRAM (DIMM). Instead of opening small window on DRAM chip plastic package for illumination by visible light, infrared light source (IR) was applied directly to chip package. RAM chips in DIMM memory modules used in notebooks and desktop computers are actually using wafer-level packaging (WLP) technology. WLP is essentially a true chip-scale package (CSP) technology. WLP-CSP used in DIMM is the smallest packages currently available. They have a thin layer of epoxy or silicon encapsulant on top that is transparent to near infrared light (700 nm-1100 nm), particularly to some wavelengths In these chips die is on top (flip-chip) and metal interconnections does not interfere with light. IR light penetrates deeply to die and is absorbed in the die, near active layer, generating electron-hole pairs. Electron-hole pairs diffuse to chip active layer and generate discharging photocurrents in NMOS transistors' drains and trench capacitor's N+ plate-P die PN junction areas, see FIG. 4 which shows DRAM cell cross section. Diffusion lengths in highly resistive dies are >200 um which is even more than die thickness. FIG. 6 shows photocurrent measurement in DIMM SDRAM chip illuminated by 980 nm IR light. Actually this photocurrent is bitline photocurrent measured on chip's Vdd node. It is sum of all photocurrents generated in all cells' NMOS transistors' sources, see FIG. 4, left side on DRAM cell cross section. 20 micro Amperes is sufficient to discharge 20 micro Farad (sum of all DRAM cells' capacitances in 125 MB SDRAM chip) in 1000 ms. Single cell's capacitance is ~20 fF. DRAM cells' charge nodes are floating after chip power down (tampering by power cycling or cooling and DIMM removal) and are easily discharged by IR light flash. Actual photocurrent which discharges trench capacitor in DRAM is much bigger than 3 uA (>20×) due to large size (charge collection area) of trench capacitor's PN junction, see FIG. 4, right side on DRAM cell cross section. However it can be measured only by picoprobing using sensitive FIB&SEM equipment after chip decapsulation, top die etching and forming test trench by focused ion beam. It is the case in flip-chip packing (die on top).

Figure 3:
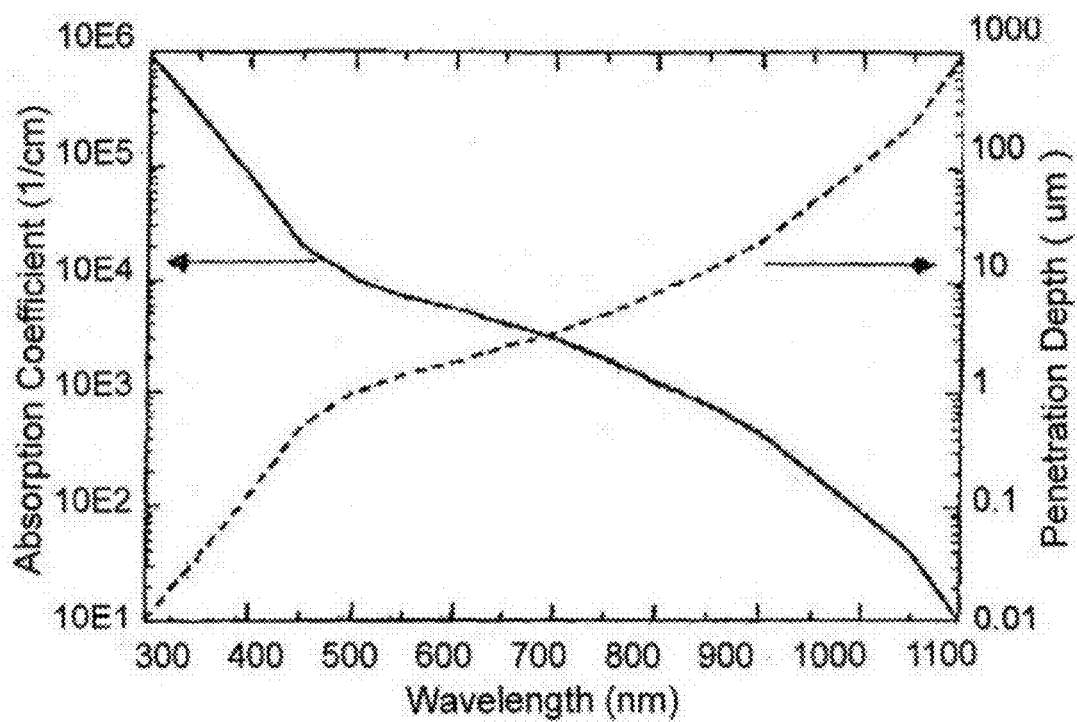
Figure 9:
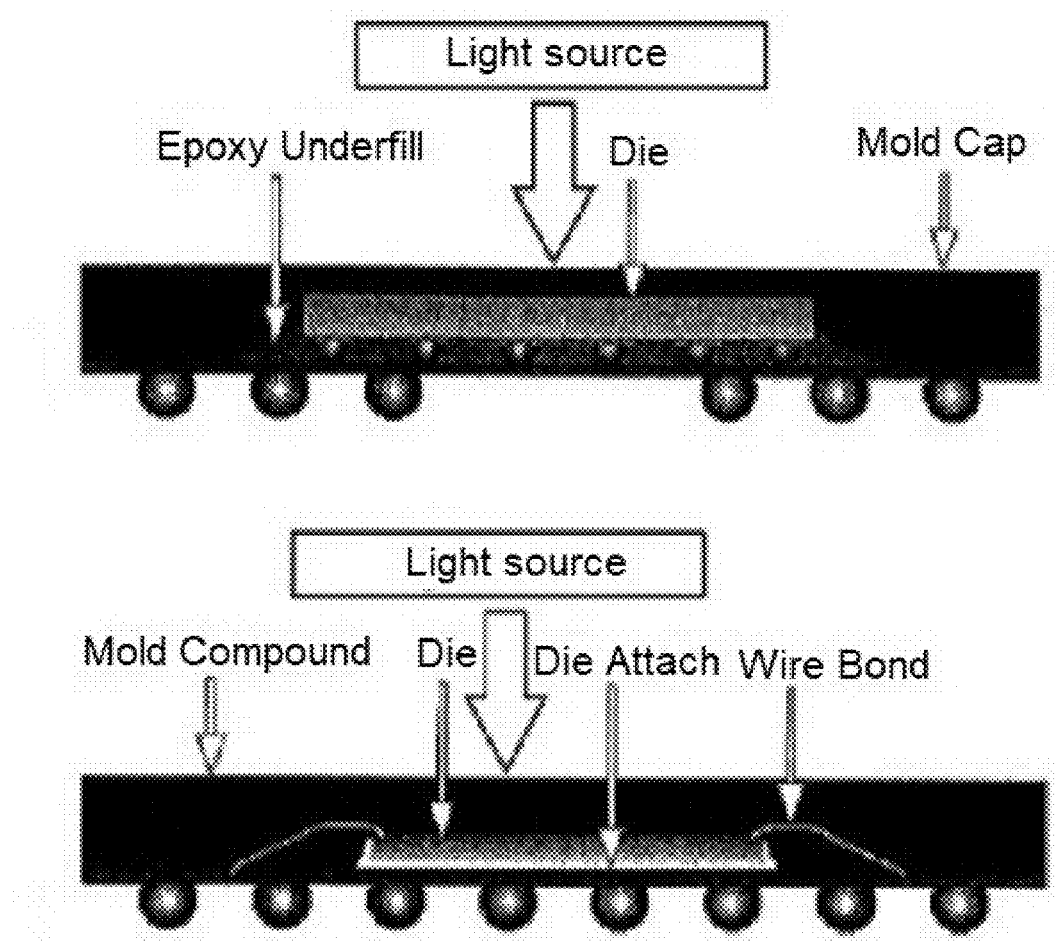

Optical memory erasure works as well in wirebond packages, where metal layers are on top. FIG. 9 shows both type of chip packages. Earlier experiments on sub 100 nm CMOS chips show that light can pass through more than 10 metal layers on top of chip active layer, be absorbed in silicon and generate photocurrents in PN junctions. The reason for extraordinary light passage is probably due to subwavelength distances between chip metal lines in the same layer which act as long subwavelength nanoslits. This effect is due to surface plasmons and it was largely researched by many laboratories. Chip erasure by IR light was tested on Altera DE1 board 512 kB SRAM chip, see FIG. 7. SRAM bitmap image was slightly distorted after 1 second but heavily distorted (erased) after 1 second using chip illumination by IR light source. Board's SDRAM BNP image display on VGA was not feasible. SDRAM chip and VGA due to clock cross domain problem require complicated setup which involves FIFO buffers and is not suitable for power cycling experiments. However, mechanism of SRAM data remanence and erasure is identical as in DRAM. SRAM data remanence was studied thoroughly by Sergei Skorobogatov from University of Cambridge, UK. DRAM cells' capacitances (~20 fF) are bigger than SRAM cells' capacitances (~1 fF). It can be compensated by increased optical power in short pulse mode. However, DRAM cell, due to large trench capacitor area, has ~20× larger photo generated charge collection area. Aforementioned Princeton experiments on laptop DIMM DRAM power cycling and booting from USB device, with memory content dumping, proved DRAM data remanence is 10 fold extended by cooling to −50 deg. C. by spraying compressed air from inverted can. Photocurrent does not depend on temperature, see FIG. 1, particularly it is not influenced by temperature decrease. At higher temperatures carriers' lifetimes and diffusion lengths are shorter due to increased scattering, but only in diffusion photocurrent mode. Selection of IR light wavelengths which penetrate fully through chip die (flipchip), see FIG. 3, is largely absorbed near or directly in chip active layers' PN junctions. Thus, photocurrent will not depend on temperature increase although increase of temperature is not an issue for memory data security. Namely, exponential increase of chip leakage with temperature would quickly erase unpowered memory's content.

Figure 1:
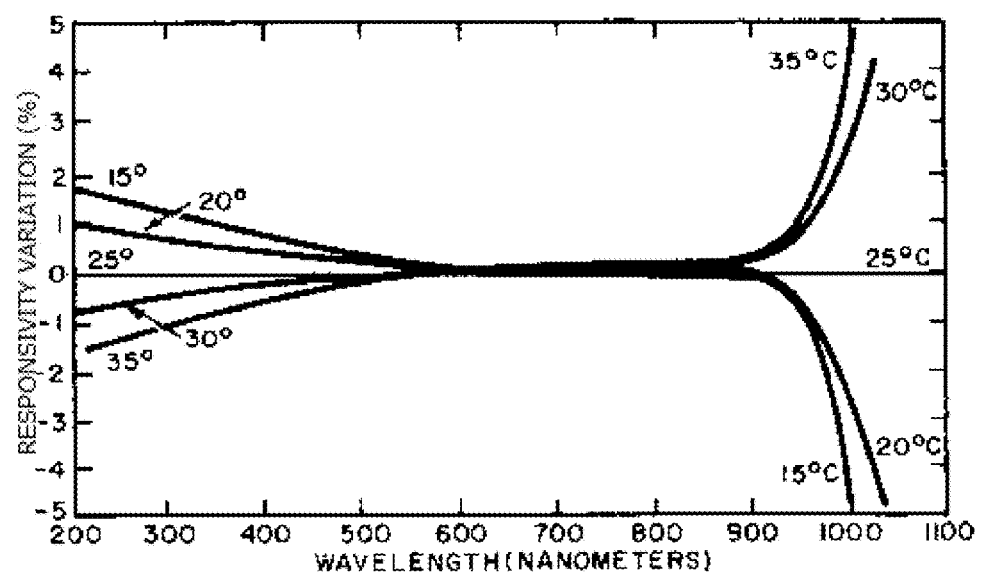

It is important to prevent negative influence of light to DRAM operation (read/write/refresh cycles). Therefore it is absolutely vital that LED is activated only when chip is powered down. During power up and operation LED should not generate light and illuminate semiconductor. Following chapter describes circuit that enables such operation of LED. During power cycling or DIMM removal from socket, LED will fire flash of light and erase data content in DRAM. Thus, circuit performs total DRAM reset upon power down even when chip cooling is applied (typically −50 deg. C.). Namely, LEDs operate normally at −50 deg. C. while photocurrent is temperature stable as well. FIG. 1 shows very low thermal coefficient (responsivity variation) for photocurrent in near IR wavelength range. Leakage, which normally causes slow data erasure after power down, decreases exponentially with temperature decrease because it depends on thermally generated charge carriers. Photocurrent, see I/V characteristic on FIG. 2, has flat current-voltage characteristic in reverse voltage (conductive mode) region. Thus, when charge node voltage is decreased to zero voltage (data erasure) photocurrent remains constant even at zero voltage. Leakage decreases exponentially with voltage decrease generating very slow discharge. Reverse PN junction leakage is studied in details in various literature.

EMBODIMENT OF THE INVENTION

IR LEDs can be applied to DIMM in two possible ways. Taiwan company Avexir Technologies Corp. sell DIMM with cooler which has LED light source incorporated to the body of cooler. The structure is patented TWM263537 and US Pat. App. 20160212825A1 (plasma tube) and the main purpose is outside appearance in gaming machines. IR LEDs can be integrated to coolers on the inside to directly illuminate DRAM chips and enable DRAM (DIMM) data erase after power down or removing DIMM from the slot. Micro battery (3V) is required to release current pulse (1 second) to IR LED after power down.

Another option is use of ultrathin (0.2 mm) functional flat fiber or light guide film (LGF) produced by several manufacturers. Light from single IR LED can be guided and extracted perpendicularly to the film, at predetermined points on the film. Film can be applied on top of DIMM. Light guide film with integrated IR LED and micro battery can be attached to DIMM during DIMM manufacturing. Self adhesive light guide film can be attached to DIMM during notebook assembly process or even afterwards. Two connections, one to power supply (battery) and the other to GND are required in order to realize DIMM optical data reset capability.

Figure 4:
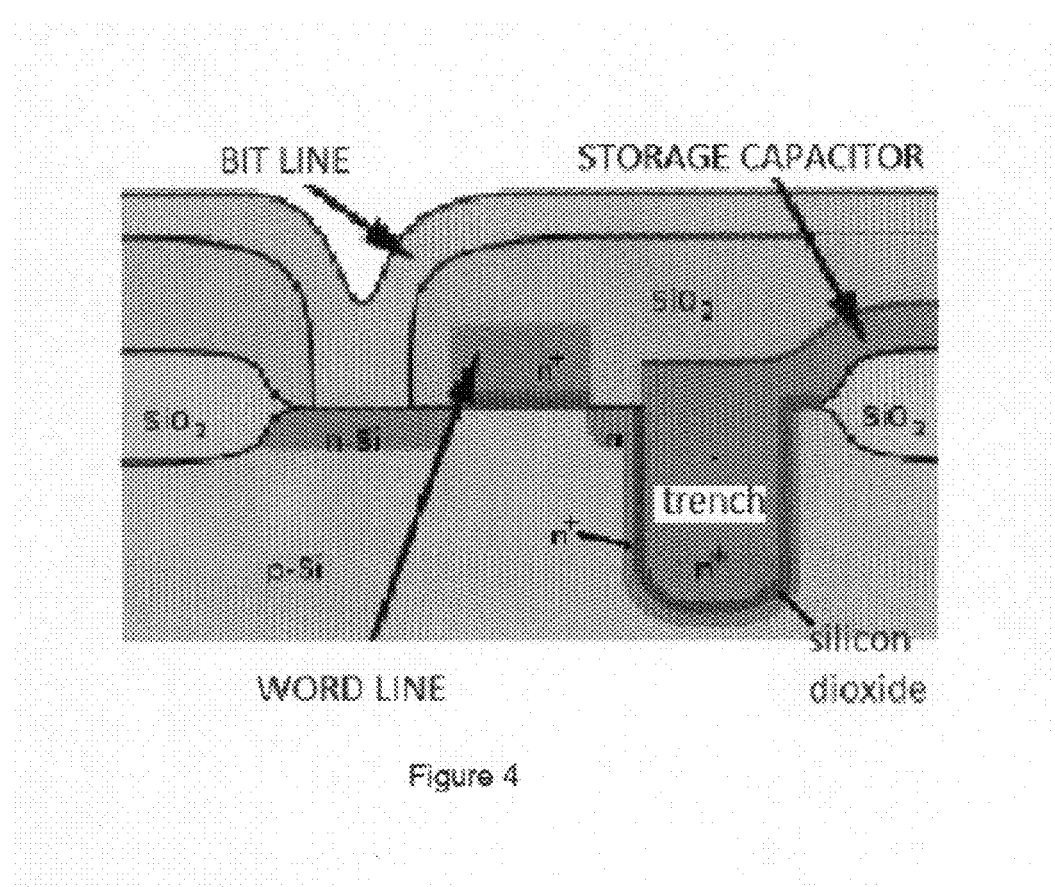
Figure 5:
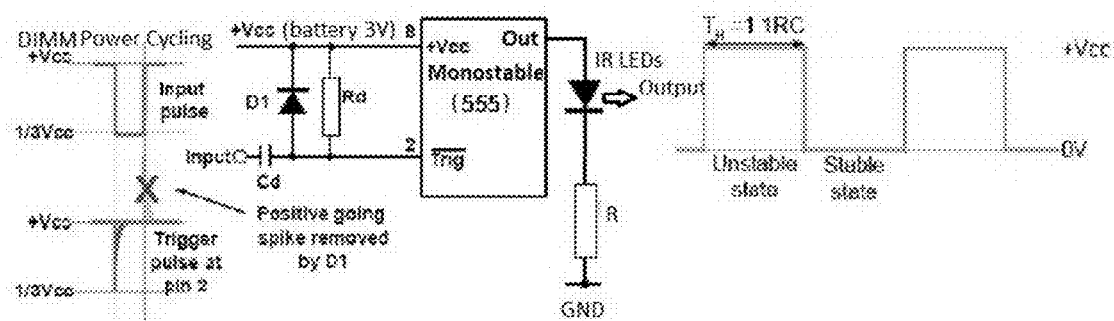
Figure 8:
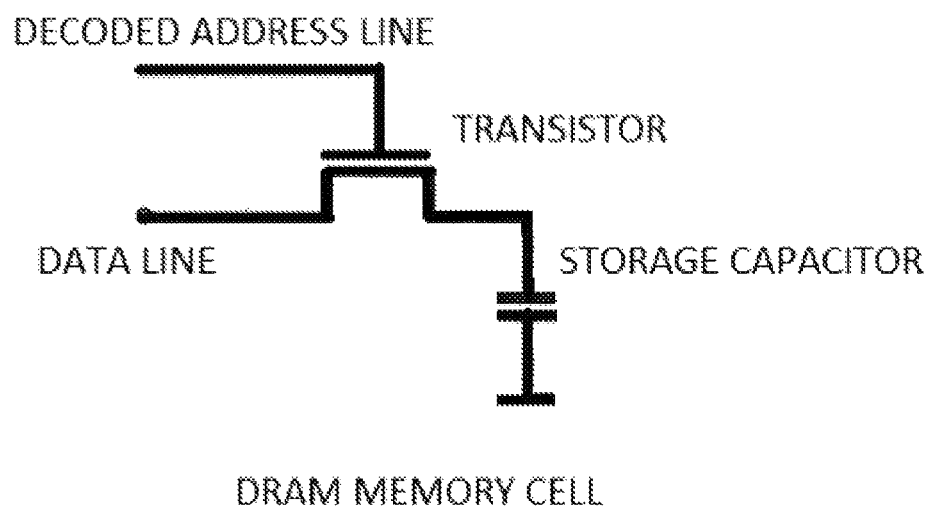

FIG. 8 shows DRAM cell scheme and FIG. 4 shows DRAM cell cross section. It is obvious that photocurrent generated in pass NMOS transistor's drain—P substrate (die) junction and trench capacitor's N+ plate-P die PN junction areas will discharge charge node in absence of periodic refreshing (read) when power is disconnected. FIG. 5 shows preferable circuit. Standard 555 monostable chip, which has extremely small dimensions and low price ~0.5 $, generates short voltage pulse on its output to drive IR LED and current limiting resistor. Max. current of 20 mA for period of 1 second can generate 5 mW (typical IR LED) of optical power. That amount of optical power generates total internal DRAM chip photocurrent in the amount of ~10 uA. It is sufficient for data erasure. On FIG. 5 it is shown that input to monostable is DIMM voltage. It is falling edge voltage (1.5 V to 0V) in case of power cycling (cold boot attack) or removal from socket. Vcc voltage is sourced from Lithium coin micro battery (3V, 290 mAh, 20 mm dia×2.5 mm, 1 $). Trigger pulse is differentiated to produce negative going spike at the falling edge of the pulse (RC circuit) while positive spike is removed by diode D1. It is a typical setup for 555 monostable with negative edge trigger. Output pulse width is independent of trigger pulse duration. Limited pulse duration (~1 second) is important to generate sufficient amount of optical energy and at the same time not to drain battery by generating IR light beyond erasure time. Monostables operate down to −50 deg. C., as well as typical IR LEDs. Thus, cooling DIMM to −50 deg. C. will not prevent DIMM DRAM chips erasure. Optical DRAM erasure circuit requires one battery (3 V), one monostable (like 555, operates at 3 V) and 8 IR LEDs. Each DRAM chip requires one IR LED (0.1 $) for illumination except in light guide film where fewer LEDs can be integrated to produce required illumination. Total price is estimated between 2$-4 $. Thus, using micro battery, monostable chip and IR LEDs, integrated to light guide (flat fiber) film or to DIMM cooler, it is possible to make safe DIMM at a price acceptable even for low end devices. LED is not working during DRAM operation but when DRAM Vcc node is discharged to low voltage, current pulse is sent through LED generating IR light pulse which illuminates chip package frontside (topside). IR light penetrates through chips' thin top cover epoxy. IR light is absorbed in DRAM die (flip chip BGA) particularly in NMOS pass transistor's drain −P die junction area and large trench capacitor PN junction area generating discharging photocurrents (P die is grounded).

Figure 10:
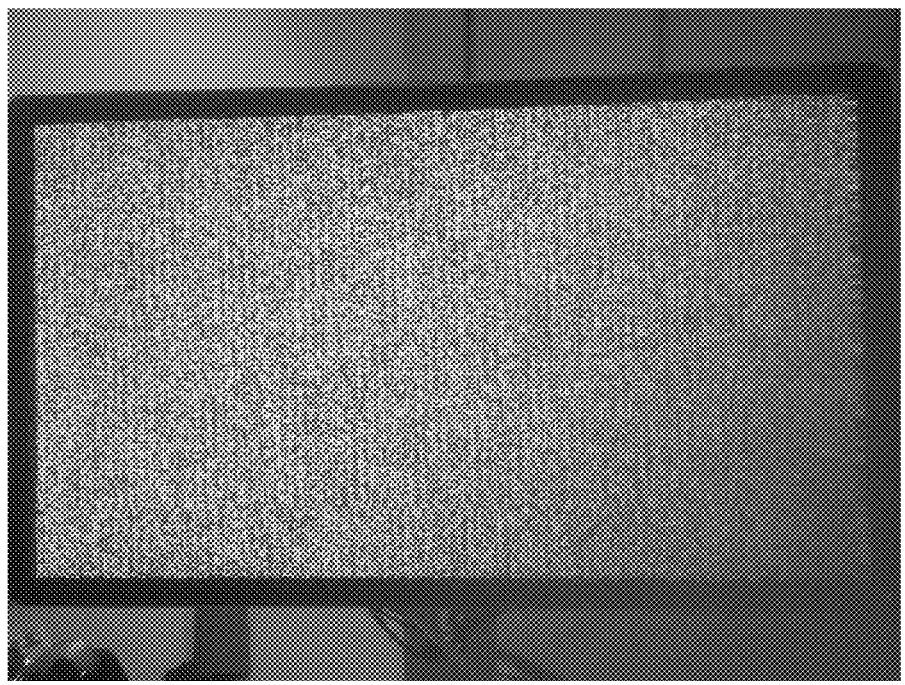

In SRAM cells the mechanism is identical when SRAM is powered down and illuminated. NMOS transistors' drains connected to charge nodes are performing optically induced data reset. When SRAM is powered up each cell is set to its skewed state generating initial intrinsic state. FIG. 10 shows Altera DE1 board's 512 kB SRAM initial intrinsic state on a VGA monitor.

It is particularly useful when SRAM cell initial power up state is used for encryption key generation. It is called chip digital fingerprinting or physical unclonable function (PUF). It is essential do delete cryptographic key immediately after key generation and chip digital authentication. This method of optical reset prevents side channel attacks like tampering by temperature etc. Concept can be easily applied to area/memory and power constrained applications like IoT and RFID devices. Namely SRAM digital fingerprinting is sensitive to temperature generated noise which introduces small noise voltages on cells' floating charge nodes. It can disturb cells' initial states (skew) on power up and cause wrong identification (large Hamming distances). It is solved by ECC (Error Correction Codes) which are consuming large amount of SRAM memory and (post processing) power. Optical (IR) power can clamp floating charge nodes to fixed, noise free, photovoltaic voltage. It enables identical, noise free, initial conditions for chip digital fingerprinting without ECC post processing. Ambient light/sunlight contains infrared spectrum components that can pass through WLP(CSP) epoxy and generate uniform PV voltage on chips' internal nodes. Change in optical power level changes PV voltage but equally throughout the whole chip.

There are different modifications to the basic concept of optical data erasure described herein, which are obvious to those skilled in the art. Also concept can be applied in 3D SRAM/DRAM chips (chip stacks), see FIG. 11, because choice of longer IR wavelength enables that all dies in a stack are illuminated. Part of the total light will be transmitted to subsequent die and part will be absorbed in initial die. For example 850 nm IR light penetrates 15 um to silicone die while 980 nm penetrates 100 um. 100 um is sufficient to penetrate through entire stack of dies. Tendency is to decrease thickness of dies in stacks from 50 um to 10 um and less in the future. FIG. 3 shows light absorption/transmission in silicon.

FIGURES

Figure 2:
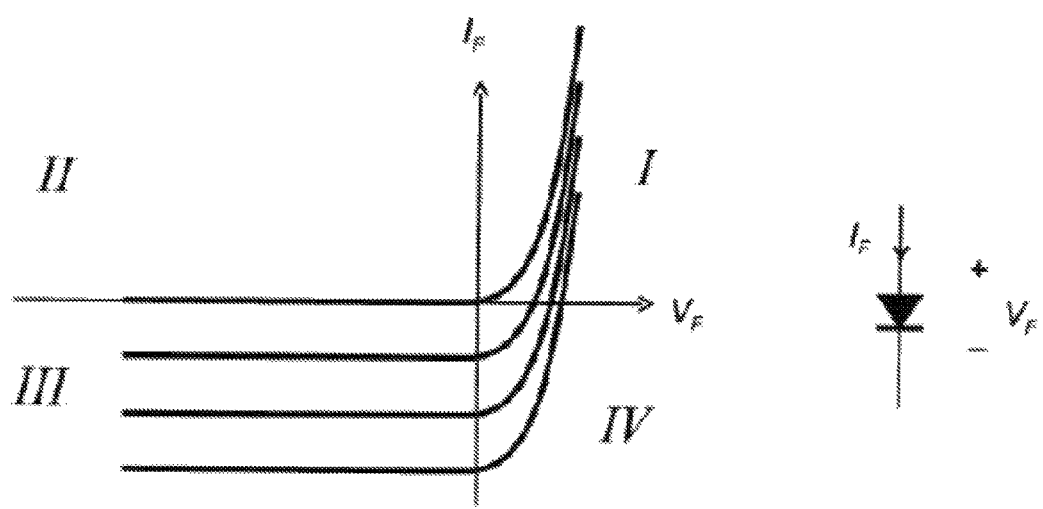
Figure 7:
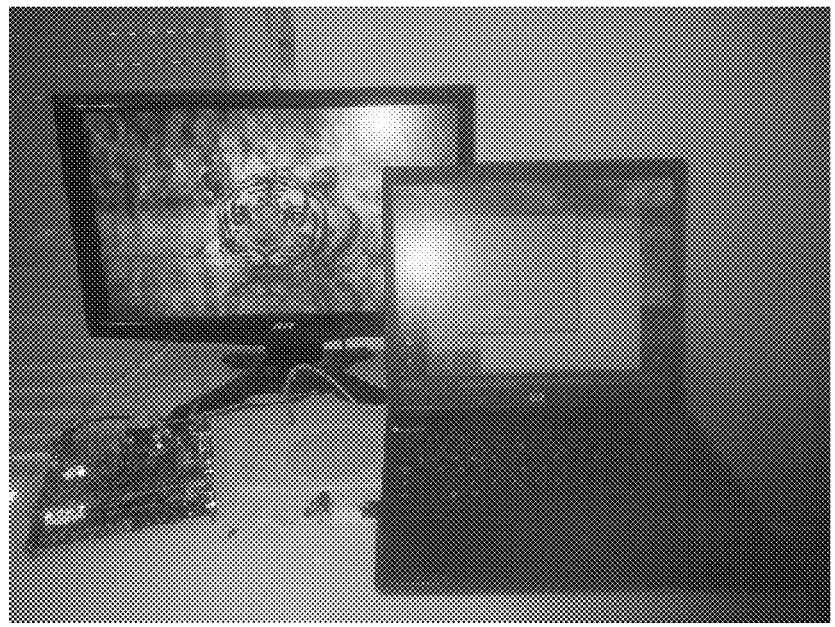
Figure 7:
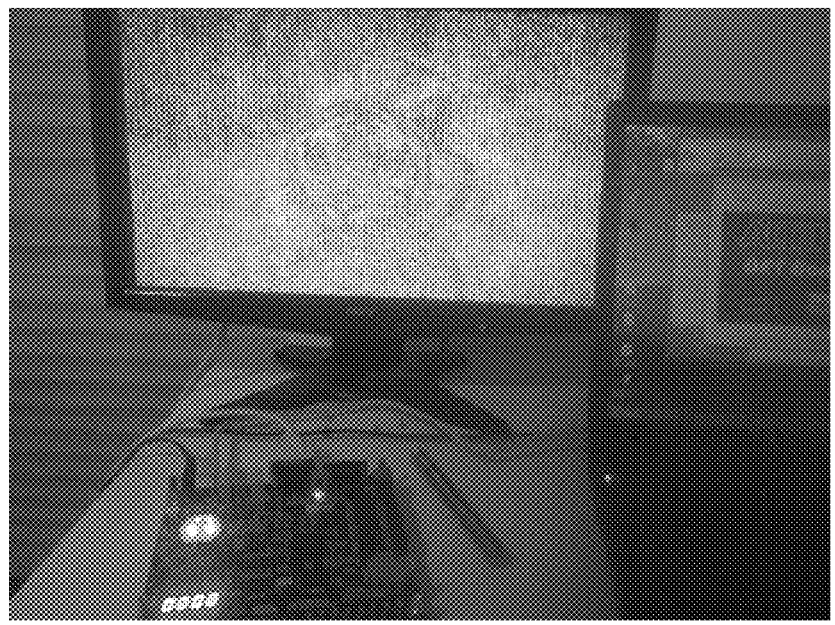
Figure 11:
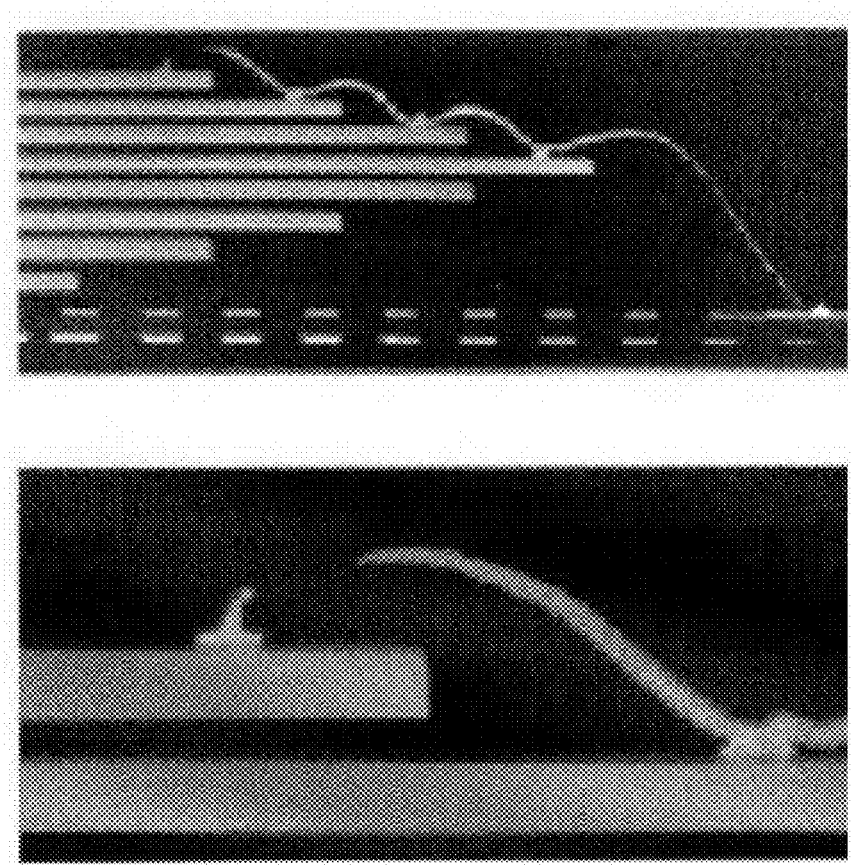

FIG. 1 shows—photocurrent/temperature characteristic
FIG. 2 shows—I/V characteristic for PN junction photo-diode
FIG. 3 shows—light penetration characteristic in silicon
FIG. 4 shows—DRAM cross section
FIG. 5—power down optical pulse generator
FIG. 6—DIMM optoelectronic experiment—Vdd node photocurrent measurement with DRAM IR illumination.
FIG. 7'—Altera DE1 board SRAM bitmap image displayed on VGA monitor after 1 second power cycling a) without chip illumination and b) with IR (980 nm, 25 mW) light illumination
FIG. 8—DRAM cell electrical scheme
FIG. 9—flip-chip (face down) and wirebond (face up) chip packages
FIG. 10—Altera DE1 board SRAM chip's digital fingerprint after full memory erase and power up.
FIG. 11—3D memory stack

The invention claimed is:

1. Dynamic Random Access Memory chip, battery voltage source, current pulse generator and near infrared light source wherein;
   Dynamic Random Access Memory chip is optically illuminated by near infrared light source attached to chip package, wherein
   aforementioned near infrared light source is activated by said battery voltage source cycling and current pulse generation by
   aforementioned current pulse generator wherein
   near infrared light penetrates through aforementioned Dynamic Random Access Memory chip's package,
   said near infrared light being absorbed in said Dynamic Random Access Memory chip's substrate and
   generates charge carriers that diffuse to chip active layer and discharge said Dynamic Random Access Memory chip's data charge nodes and erase cryptographic key stored in said Dynamic Random Access Memory chip.

2. Invention from claim 1 wherein near infrared light source is near infrared LED and light guide film (LGF) containing side emitting micro near infrared LEDs and flat fiber (FF), wherein near infrared LED and light guide film and flat fiber emit infrared light perpendicularly to the Dynamic Random Access Memory chip surface.

3. Invention from claim 1 wherein current pulse generator contains voltage source, edge triggered monostable and resistor.

4. Invention from claim 1 wherein infrared light source is attached to chip package by integration to chip package.

5. Static Random Access Memory chip, battery voltage source, current pulse generator and near infrared light source wherein;
   Static Random Access Memory chip is optically illuminated by near infrared light source attached to chip package, wherein
   aforementioned near infrared light source is activated by said battery voltage source cycling and current pulse generation by
   aforementioned current pulse generator wherein
   near infrared light penetrates through aforementioned Static Random Access Memory chip's package,
   said near infrared light being absorbed in said Static Random Access Memory chip's substrate and generates charge carriers that diffuse to chip active layer and discharge said Static Random Access Memory chip's data charge nodes and erase cryptographic key stored in said Static Random Access Memory chip.

6. Invention from claim 5 wherein near infrared light source is near infrared LED and light guide film (LGF) containing side emitting micro near infrared LEDs and flat fiber (FF), wherein near infrared LED and light guide film and flat fiber emit infrared light perpendicularly to the Static Random Access Memory chip surface.

7. Invention from claim 5 wherein current pulse generator contains voltage source, edge triggered monostable and resistor.

8. Invention from claim 5 wherein infrared light source is attached to chip package by integration to chip package.

* * * * *